(12) United States Patent
Tsai et al.

(10) Patent No.: US 6,706,587 B1
(45) Date of Patent: Mar. 16, 2004

(54) METHOD FOR FORMING BURIED PLATES

(75) Inventors: Tzu-Ching Tsai, Taichung Hsien (TW); Hui Min Mao, Tainan Hsien (TW); Ying Huan Chuang, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/406,371

(22) Filed: Apr. 3, 2003

(30) Foreign Application Priority Data

Sep. 27, 2002 (TW) ..................................... 91122280 A

(51) Int. Cl.⁷ .......................................... H01L 21/8242
(52) U.S. Cl. ........................ 438/243; 438/246; 438/249; 438/255
(58) Field of Search ................................ 438/243–249, 438/386–392, 255, 398

(56) References Cited

U.S. PATENT DOCUMENTS 5,191,509 A  *  3/1993  Wen

* cited by examiner

*Primary Examiner*—H. Jey Tsai
(74) *Attorney, Agent, or Firm*—Nelson A. Quintero

(57) ABSTRACT

Method for forming buried plates. The method includes providing a substrate formed with a pad stacked layer on the surface, a bottle trench and a protective layer on the upper sidewalls of the bottle trench, forming a doped hemispherical silicon grain (HSG) layer on the protective layer and the sidewalls and bottom of the bottle trench, removing the hemispherical silicon grain layer on the protective layer without removing the hemispherical silicon grain layer from the lower sidewalls and bottom of the bottle trench, forming a covering layer on the protective layer, and subjecting the doped hemispherical silicon grain layer to drive-in annealing so that ions in the HSG layer diffuse out to the substrate, thereby forming a buried plate within the lower sidewalls of the bottle trench.

14 Claims, 4 Drawing Sheets

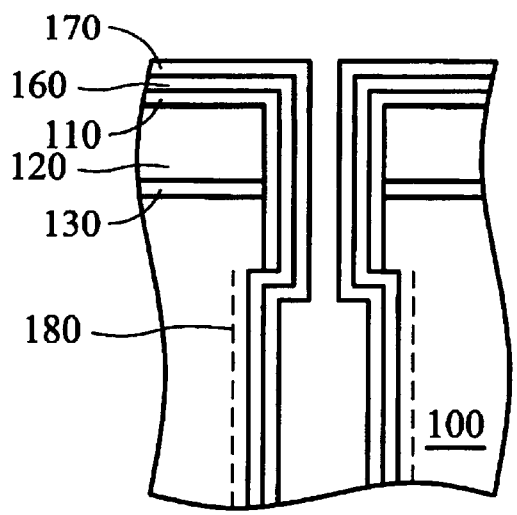
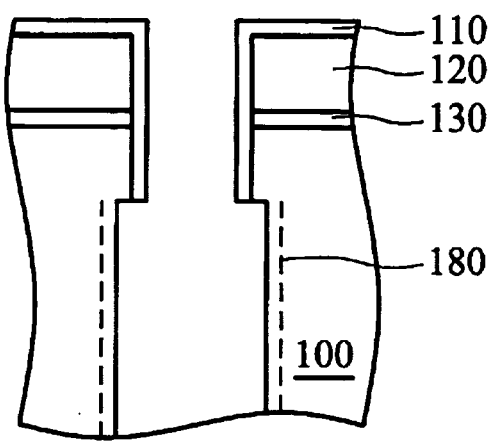
FIG. 1e  FIG. 1f
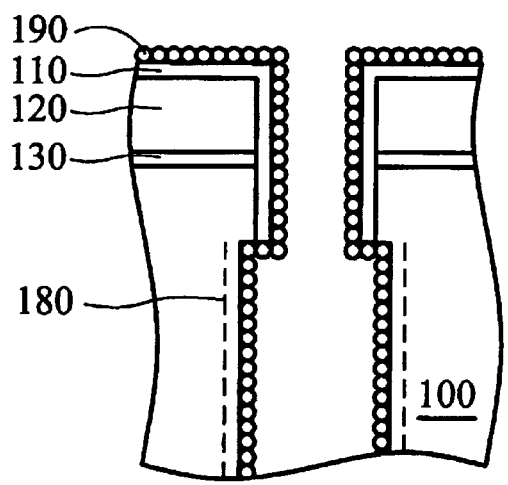
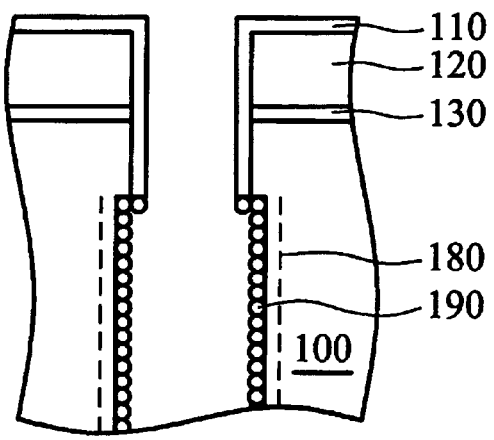
FIG. 1g  FIG. 1h

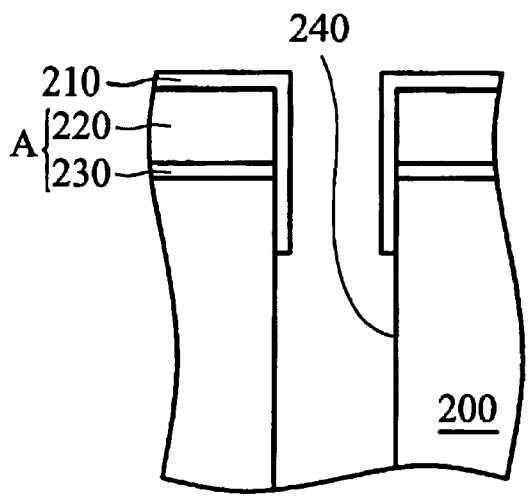
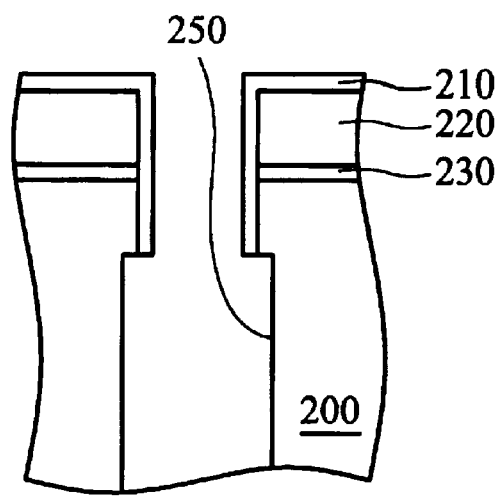
FIG. 2aFIG. 2b
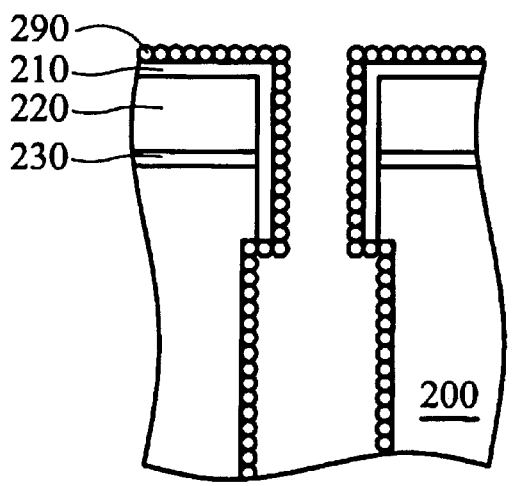
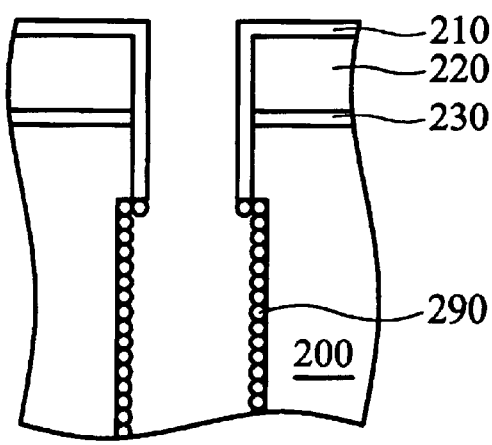
FIG. 2cFIG. 2d

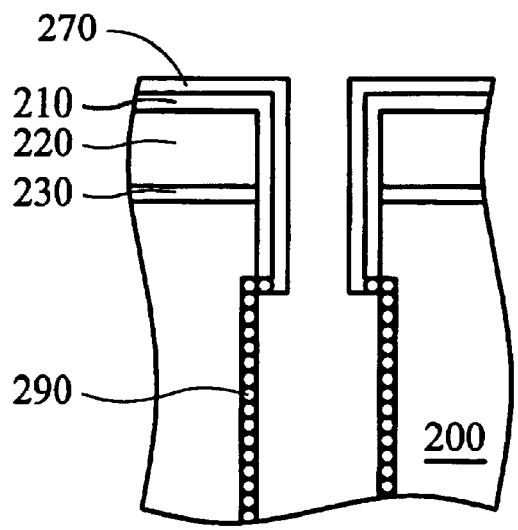
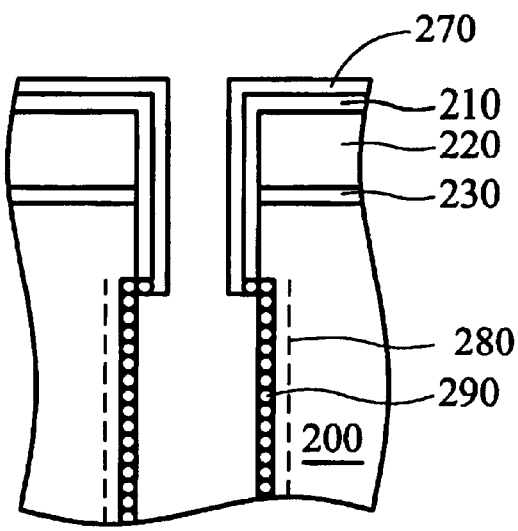
FIG. 2e  FIG. 2f
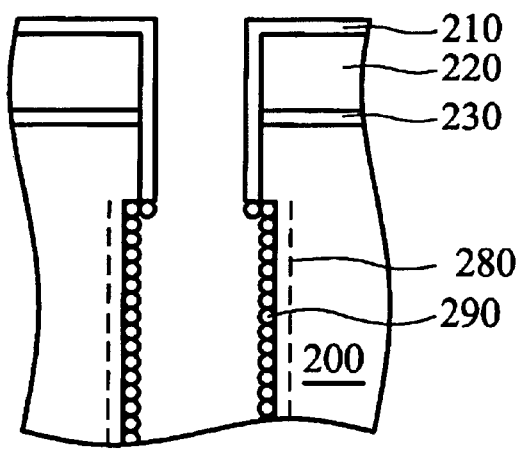
FIG. 2g

METHOD FOR FORMING BURIED PLATES

BACKGROUND OF THE INVENTION

1. Field of the Invention

The present invention relates to a method for forming buried plates. In particular, the invention involves the formation of buried plates in trench capacitors of DRAMs by drive-in annealing of hemispherical silicon grain (HSG).

2. Description of the Related Art

In the current process for fabricating semiconductor integrated circuits, particularly the 64 and 256 MB memory chips, deep trenches are widely used to define the storage capacitors. The general structure of a storage capacitor is comprised of a deep trench formed within a doped silicon substrate, a dielectric layer formed on the inner surface of the deep trench, and doped silicon that fills the deep trench. In other words, the doped silicon/dielectric layer/doped silicon structure forms the storage capacitor. In the continuous development of smaller sizes of capacitors, the thickness of the dielectric layer must be decreased to maintain its capacitance. Consequently, voltage of the overall dielectric layer must be greatly reduced to avoid undesired voltage breakdown effect. In order to achieve reduced voltage, a doped area i.e. a buried plate, is formed around the bottom part of the storage capacitor.

An example of current process for forming buried plates in deep trench DRAMs is shown in FIGS. 1a~1h. First, a deep trench 140 is formed in a predetermined position in a semiconductor substrate 100, wherein a pad stacked layer A is formed on the substrate in advance. The pad stacked layer A comprises a pad oxide layer 130 and a pad nitride layer 120. Next, a protective layer 110 is formed on the upper sidewalls of the trench, as shown in FIG. 1a. Etching is then carried out to widen the lower portion of the trench not covered by the protective layer to form a bottle trench 150, shown in FIG. 1b.

Next, as shown in FIGS. 1c and 1d, an arsenic-doped silicon dioxide glass (ASG) layer 160 and a tetraethylorthosilane (TEOS) layer 170 are formed along the protective layer 110 and the sidewalls and bottom of the bottle trench 150. Drive-in is then performed to form an inner plate 180 within the sidewalls of the bottle trench, as shown in FIG. 1e.

Then, the ASG layer 160 and TEOS layer 170 are removed as shown in FIG. 1f, followed by formation of a hemispherical silicon grain (HSG) layer 190 on the protective layer 110 and the sidewalls and bottom of the bottle trench 150. Finally, as shown in FIG. 1h, the HSG layer on the protective layer 110 is removed and the HSG layer on the sidewalls and bottom of the bottle trench remains.

In the process described above, overhang is easily caused in the trench due to the sequential formation of ASG layer and TEOS layer in the micro-sized trenches continuously reduced in size. This is not advantageous to the subsequent process for bottle trenches, as process complexity is increased. Consequently, current processes are no longer applicable.

SUMMARY OF THE INVENTION

In order to overcome the above problems, an object of the invention is to provide a method for forming buried plates that avoids the overhang problem and requires fewer steps to form trench capacitors with good performance.

In order to achieve the above objects, there is provided a method for forming buried plates, wherein the formation of ASG layer is omitted and the HSG layer is formed directly after the formation of the bottle trench. A protective layer of TEOS is then formed on the upper portion of the bottle trench, followed by drive-in to form a buried plate. According to the method provided, the number of steps is decreased and overhang problem is avoided.

The method for forming buried plates provided in the present invention comprises providing a substrate formed with a pad stacked layer on the surface, a bottle trench and a protective layer on the upper sidewalls of the bottle trench, forming a doped hemispherical silicon grain (HSG) layer on the protective layer and the sidewalls and bottom of the bottle trench, removing the hemispherical silicon grain layer on the protective layer without removing the hemispherical silicon grain layer on the lower sidewalls and bottom of the bottle trench, forming a covering layer on the protective layer, and subjecting the doped hemispherical silicon grain layer to drive-in annealing so that ions in the HSG layer diffuse out to the substrate, thereby forming a buried plate within the lower sidewalls of the bottle trench.

According to another aspect of the present invention, the method for forming buried plates comprises forming a pad stacked layer on a substrate, defining the pad stacked layer and the substrate to form a deep trench in the substrate; forming a protective layer to cover the pad stacked layer and the upper sidewalls of the deep trench, forming a bottle trench at the lower part of the deep trench; forming a doped hemispherical silicon grain (HSG) layer along the protective layer and the sidewalls of the bottle trench, forming a covering layer on the protective layer, and subjecting the HSG layer to drive-in, thus diffusing the ions doped in the HSG layer to the silicon substrate and forming a buried plate in the sidewalls of the bottle trench.

According to the present invention, the hemispherical silicon grain is preferably doped with dopant such as As. The covering layer is preferably tetraethylorthosilane (TEOS), or silicon nitride (SiN). The protective layer is preferably silicon nitride (SiN) or silicon oxide ($SiO_2$). The pad stacked layer comprises a pad oxide layer and a pad nitride layer, sequentially formed by chemical vapor deposition.

In the method for forming buried plates provided in the present invention, the advantages include prevention of overhang and fewer steps, consequently saving production time and costs. As a result, this method helps continuous development of DRAM fabrication at a finer scale, especially for generations less than 0.11 $\mu$m.

The present invention will become more fully understood from the detailed description given hereinbelow and the accompanying drawings, given by way of illustration only and thus not intended to be limitative of the present invention.

BRIEF DESCRIPTION OF THE DRAWINGS

FIG. 1a~1h are cross-sections of the method for forming buried plates according to a conventional method.

FIG. 2a~2g illustrate the process of forming buried plates according to the method provided in the present invention.

DETAILED DESCRIPTION OF THE INVENTION

Figure 1A:
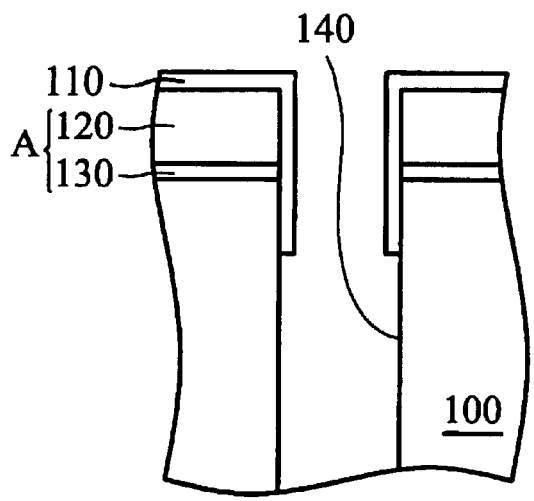
Figure 1B:
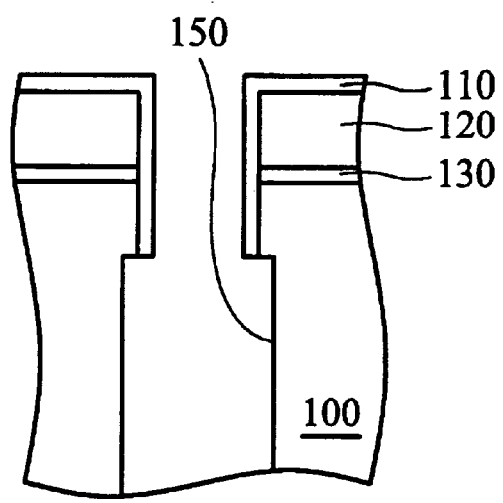
Figure 1C:
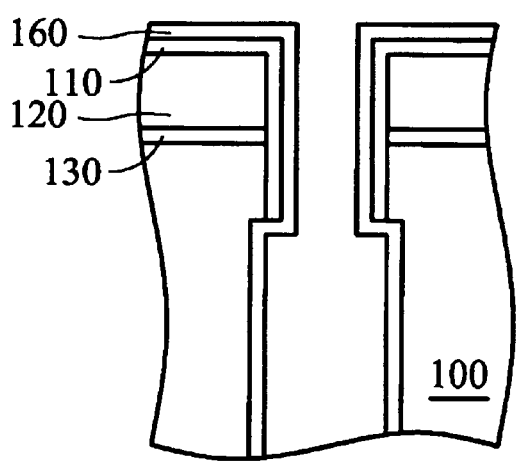
Figure 1D:
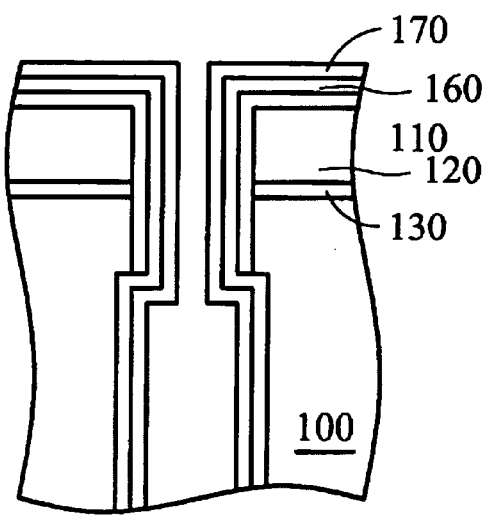

FIGS. 2a~2g illustrate the process of forming buried plates according to the method of the present invention.

FIG. 2a illustrates the first step of the invention, wherein a semiconductor substrate 200, such as silicon, is provided. Next, a pad stacked layer is formed on the substrate 100, for example, by chemical vapor deposition (CVD). The pad stacked layer includes a silicon nitride layer 220 and a silicon oxide layer 230. The silicon nitride layer 220 is formed on the substrate 200 and the silicon oxide layer 230 is formed on the silicon nitride layer 220. The pad stacked layer is used as a hard mask later in the etching step.

Then, an opening is formed in the pad stacked layer to expose partial surface of the substrate. This opening formation is sequentially carried out by coating of a patterned photoresist, photolithography and etching, such as reactive ion etching (RIE) or plasma etching. A trench 240, shown in FIG. 2a, is then formed by anisotropic dry etching, such as RIE or plasma etching.

Next, an insulation layer is formed on the sidewalls and bottom of the trench 240, followed by filling the lower portion of the trench with a photoresist material. Photolighography is then performed to remove the exposed photoresist. The insulation layer on the lower sidewalls of the trench is removed at the same time. The remaining insulation layer on the upper portion of the trench 240 forms the protective layer 210. The insulation layer is preferably silicon oxide (SiO2) and silicon nitride (SiN). Preferable thickness is about 100 angstroms. The protective layer protects the upper portion of the trench from damage by ion implantation and oxidation in later steps. Thickness and depth of the protective layer are not restricted, they can be modified according to the process.

Next, as shown in FIG. 2c, sidewalls and bottom of the trench not covered by the protective layer 210 are wet etched to form a bottle trench 250 having increased radius at the lower part of the trench. Then, hemispherical silicon grain (HSG) layer 290 doped with As ions is formed to cover the protective layer 210 and the sidewalls and bottom of the trench.

Isotropic dry etching is then performed to remove the HSG layer from the protective layer 210, as shown in FIG. 2d. The HSG layer on the sidewalls and bottom of the trench 250 remain. Then, low pressure CVD is carried out to form a covering layer 270 of TEOS on the protective layer 210 and HSG layer 290, as shown in FIG. 2e. The covering layer 270 is formed so that the As ions in the HSG layer diffuse out in a single direction to the sidewalls of the bottle trench 250.

Drive-in is then performed on the HSG layer 290, thus As ions in the HSG layer diffuse out to the sidewalls of the bottle trench 250 to form a buried plate 280 within the lower sidewalls of the bottle trench 250. The drive-in is preferably performed by drive-in annealing.

After the above steps, the covering layer 270 of TEOS can be removed conventionally as required, as shown in FIG. 2g.

According to the method for forming buried plates of the present invention, instead of forming Arsenic doped silicon glass (ASG), a hemispherical silicon grain layer doped with ions is used as the dopant source to form the buried plate. Consequently, the formation of ASG layer and TEOS layer and protective layer in the deep trench are avoided, thereby preventing overhang. At the same time, the number of steps is reduced to lower production costs and time. This brings advantages to further improvement in the current DRAM processes.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming buried plates, comprising:
   providing a substrate formed with a pad stacked layer on the top, a bottle trench and a protective layer on the upper portions of sidewalls of the bottle trench;
   forming a doped hemispherical silicon grain (HSG) layer on the protective layer and the sidewalls and bottom of the bottle trench;
   removing the hemispherical silicon grain layer on the protective layer without removing the hemispherical silicon grain layer on the lower sidewalls and bottom of the bottle trench;
   forming a covering layer on the protective layer; and
   subjecting the doped hemispherical silicon grain layer to drive-in annealing so that ions in the HSG layer diffuse out to the substrate, thereby forming a buried plate within the lower sidewalls of the bottle trench.

2. The method as claimed in claim 1 further comprising removing the covering layer.

3. The method as claimed in claim 1, wherein the dopant in the HSG layer is As.

4. The method as claimed in claim 2, wherein the covering layer is tetraethylorthosilane (TEOS).

5. The method as claimed in claim 1, wherein the protective layer is silicon nitride (SiN).

6. The method as claimed in claim 1, wherein the pad stacked layer comprises a pad oxide layer and a pad nitride layer.

7. The method as claimed in claim 6, wherein the pad stacked layer is formed by chemical vapor deposition.

8. A method for forming buried plate, comprising the steps of:
   forming a pad stacked layer on a substrate;
   defining the pad stacked layer and the substrate to form a deep trench in the substrate;
   forming a protective layer to cover the pad stacked layer and the upper sidewalls of the deep trench;
   forming a bottle trench in the lower part of the deep trench;
   forming a doped hemispherical silicon grain (HSG) layer along the protective layer and the sidewalls of the bottle trench;
   forming a covering layer on the protective layer; and
   subjecting the HSG layer to drive-in annealing, such that the ions doped in the HSG layer diffuse to the silicon substrate and form a buried plate in the sidewalls of the bottle trench.

9. The method as claimed in claim 8, further comprising removing the covering layer.

10. The method as claimed in claim 8, wherein the dopant in the HSG layer is As.

11. The method as claimed in claim 8, wherein the covering layer is tetraethylorthosilicate (TEOS).

12. The method as claimed in claim 8, wherein the protective layer is silicon nitride (SiN).

13. The method as claimed in claim 8, wherein the pad stacked layer comprises a pad oxide layer and a pad nitride layer.

14. The method as claimed in claim 13, wherein the pad stacked layer is formed by chemical vapor deposition (CVD).

* * * * *